United States Patent
Piew et al.

(10) Patent No.: US 6,362,102 B1
(45) Date of Patent: Mar. 26, 2002

(54) METHOD OF FORMING TOP METAL CONTACT TO ANTIFUSE

(75) Inventors: Say Gut Piew; Madhusudan Mukhopadhyay; Yeow Meng Teo, all of Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 09/472,415

(22) Filed: Dec. 27, 1999

(51) Int. Cl.[7] ................ H01L 21/302; H01L 21/311; H01L 21/461
(52) U.S. Cl. ........................................ 438/689; 438/696
(58) Field of Search ................................. 438/689, 696

(56) References Cited

U.S. PATENT DOCUMENTS

| | | | |
|---|---|---|---|
| 5,272,101 A | * 12/1993 | Forouhi et al. | 438/689 |
| 5,387,812 A | * 2/1995 | Forouhi et al. | 23/48 |
| 5,602,053 A | 2/1997 | Zheng et al. | 437/60 |
| 5,670,818 A | * 9/1997 | Forouhi et al. | 257/530 |
| 5,763,299 A | 6/1998 | McCollum et al. | 438/131 |
| 5,920,109 A | 7/1999 | Hawley et al. | 257/530 |

* cited by examiner

*Primary Examiner*—Felisa Hiteshew (57) ABSTRACT

A method for fabricating a self-aligned antifuse cell is described. An antifuse is provided overlying a metal plug in an insulating layer on a semiconductor substrate. A dielectric layer is deposited overlying the antifuse. The dielectric layer is etched to form dielectric spacers on the sidewalls of the antifuse. A top metal layer is deposited overlying the antifuse and dielectric spacers and patterned to complete the antifuse cell in an integrated circuit device.

29 Claims, 9 Drawing Sheets

METHOD OF FORMING TOP METAL CONTACT TO ANTIFUSE

BACKGROUND OF THE INVENTION (1) Field of the Invention

The invention relates to the fabrication of integrated circuit devices, and more particularly, to a method of forming a self-aligned antifuse in the fabrication of integrated circuits.

(2) Description of the Prior Art

Figure 1:
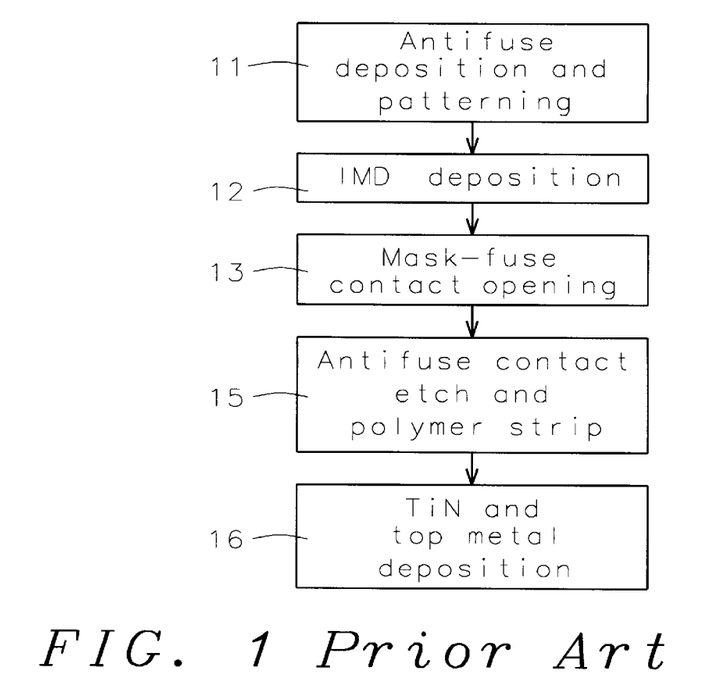
FIG. 1 is a flow chart of a prior art antifuse cell process.
Figure 2:
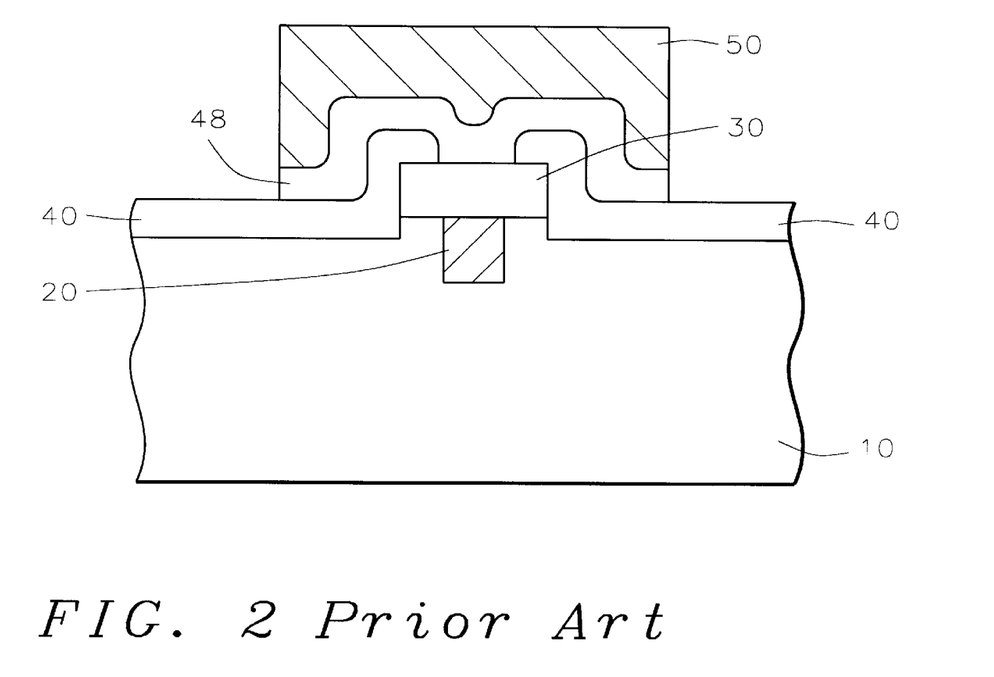
FIG. 2 schematically illustrates in cross-sectional representation an antifuse cell of the prior art.

FIG. 1 is a flowchart of a typical antifuse cell process flow. In the fabrication of antifuse cells for programmable gate arrays, an antifuse material layer is deposited, patterned and etched (step 11), followed by a blanket intermetal dielectric deposition (step 12). Subsequently, a mask is used to open a contact to the antifuse (step 13), followed by the antifuse contact etch (step 15) and top metal deposition (step 16). FIG. 2 illustrates a typical antifuse cell of the prior art. A metal plug 20 is shown within a substrate 10. Antifuse material 30 has been deposited and patterned overlying the metal plug. Intermetal dielectric layer 40 has been deposited. A contact opening has been opened in the intermetal dielectric layer 40. A barrier layer 48, such as titanium nitride, is deposited over the intermetal dielectric layer 40 and within the opening followed by top metal layer 50.

However, this method has encountered programming yield failures due to the following reasons: 1) generation of excessive polymer at the antifuse contact area during etching, 2) antifuse contact area is limited by the antifuse contact via size, 3) antifuse alignment process margin, 4) ineffectiveness of the cleaning process in cleaning the generated polymer off the top of the antifuse, and 5) some areas inside circuits are unusable because of programming yield. It is desired to form an antifuse cell without opening a contact to the antifuse material.

U.S. Pat. Nos. 5,920,109 to Hawley et al and 5,763,299 to McCollum et al teach the formation of oxide spacers on the sidewalls of an antifuse. U.S. Pat. No. 5,602,053 to Zheng et al teaches formation of an antifuse structure.

SUMMARY OF THE INVENTION

A principal object of the present invention is to provide an effective and very manufacturable method of fabricating an antifuse cell for programmable gate array.

A further object of the invention is to provide a self-aligned method of fabricating an antifuse cell.

Yet another object is to provide a method of fabricating an antifuse cell where the fuse contact area is not limited by fuse via size.

A still further object is to provide a method of fabricating an antifuse cell having an increased contact area between the top metal and the antifuse.

In accordance with the objects of this invention a method for fabricating a self-aligned antifuse cell is achieved. An antifuse is provided overlying a metal plug in an insulating layer on a semiconductor substrate. A dielectric layer is deposited overlying the antifuse. The dielectric layer is etched to form dielectric spacers on the sidewalls of the antifuse. A top metal layer is deposited overlying the antifuse and dielectric spacers and patterned to complete the antifuse cell in an integrated circuit device.

BRIEF DESCRIPTION OF THE DRAWINGS

In the accompanying drawings forming a material part of this description, there is shown:

FIGS. 4 through 17 schematically illustrate in cross-sectional representation a preferred embodiment of the present invention.

DESCRIPTION OF THE PREFERRED EMBODIMENTS

The process of the present invention provides a method of forming a top metal contact to an antifuse. This process has fewer process steps than previous methods. There is no photoresist layer formed on top of the antifuse, so less polymer is generated, leading to higher programming yields. The self-aligned antifuse process of the invention has an increased contact area between the top metal and the antifuse material because the fuse contact area is not limited by via size. A zero overlap fuse can be made using this technique. A zero overlap fuse has no overhang on both sides of the antifuse.

Figure 3:
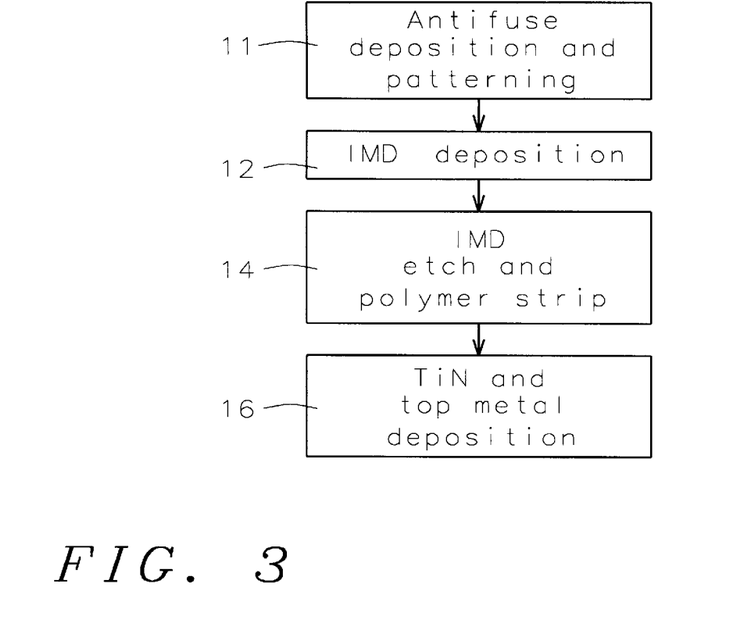
FIG. 3 is a flow chart of the antifuse cell process of the present invention.

The process of the present invention implements an etching of the intermetal dielectric layer over the patterned antifuse material rather than opening a contact to the antifuse. FIG. 3 is a flow chart of the antifuse process of the present invention. The antifuse material is deposited and patterned (step 11), followed by the intermetal dielectric layer deposition (step 12). The intermetal dielectric layer is etched and polymer removed (step 14). This etching is similar to a spacer etching and is followed by top metal deposition (step 16). Three alternative intermetal dielectric compositions and etching techniques will be described.

Figure 4:
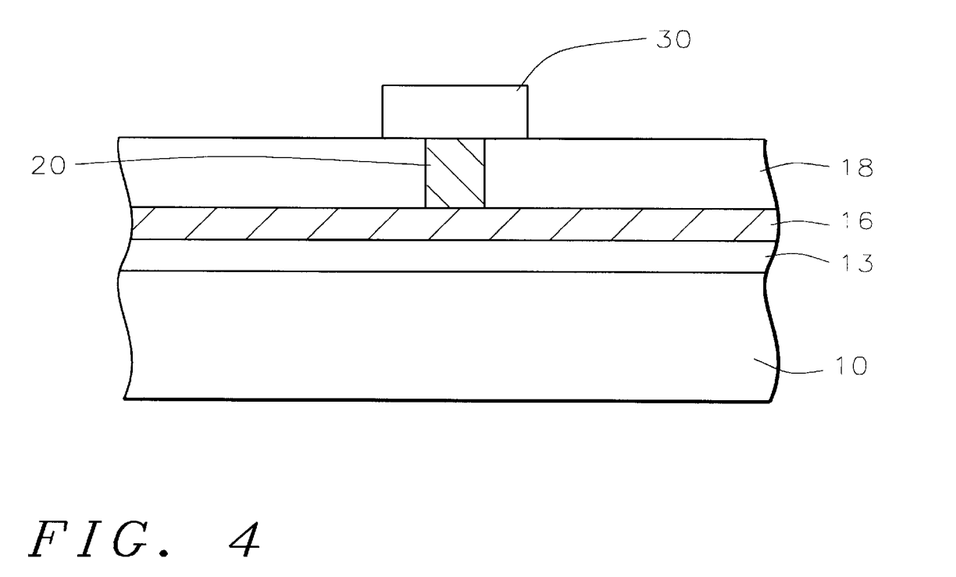

Referring now more particularly to FIG. 4, there is shown an illustration of a portion of a partially completed integrated circuit. The semiconductor substrate 10 is preferably composed of silicon having a Si(100) crystallographic orientation. Semiconductor device structures are formed in and on the semiconductor substrate.

These semiconductor device structures may include gate electrodes and associated source and drain regions, not shown, and metallization. Semiconductor device structures, not shown, are formed within layer 13 and covered by an insulating layer. A first level metallization is formed over level 13 and may include electrical contacts, not shown, to structures within layer 13. Metal lines 16 are shown overlying layer 13.

An intermetal dielectric layer 18 is deposited over the metal lines, as shown in FIG. 4. Via openings are made through the dielectric layer to contact the first metal lines. A metal plug, such as tungsten 20, is formed within the via openings.

Now, the antifuse cell is to be fabricated. The antifuse material is deposited over the surface of the substrate and contacting the tungsten plugs 20. The antifuse material may be, for example, amorphous silicon, amorphous silicon germanium, or amorphous silicon germanium carbon, and have a thickness of between about 200 and 2000 Angstroms. The thickness of the antifuse material depends upon the breakdown voltage. The antifuse material layer is patterned to form the antifuse 30, as shown, and cleaned.

Now, the key step of the invention will be described. In the prior art, the intermetal dielectric layer is blanket deposited, then a contact opening is etched through the intermetal dielectric layer to the antifuse material. This causes the problems described above, such as excess polymer generation and difficulties of removing the polymer adequately, limitation of the antifuse contact area, and antifuse alignment process margin. The present invention avoids the masking and contact opening steps of the prior art and their attendant problems. In the present invention, the intermetal dielectric layer is blanket deposited and etched in a way similar to a spacer etch, providing a self-aligned antifuse with increased antifuse to top metal contact area, less polymer generation, and higher programming yield. The intermetal dielectric layer of the present invention comprises multiple layers of silicon-based dielectrics.

Figure 5:
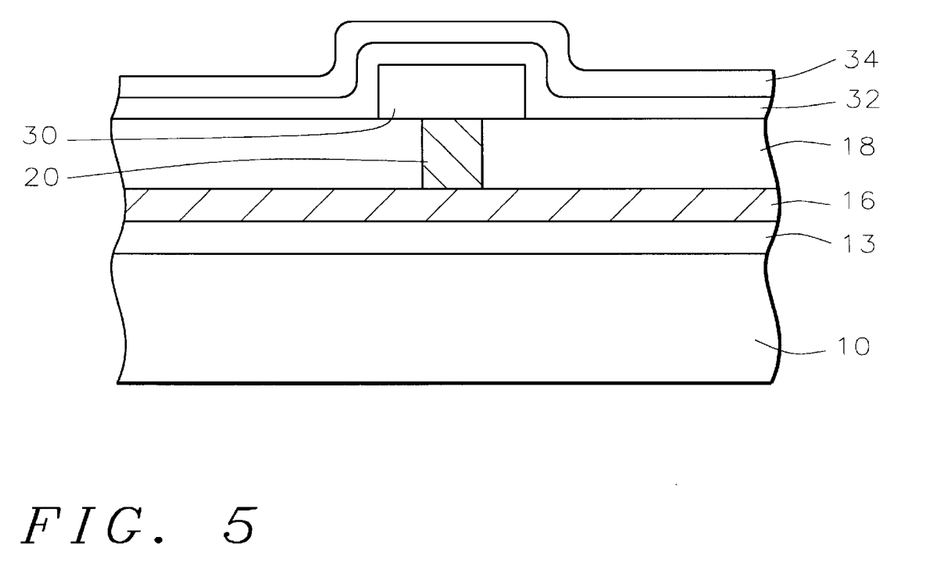
FIGS. 5 through 7 schematically illustrate in cross-sectional representation a first alternative in the preferred embodiment of the present invention.
Figure 6:
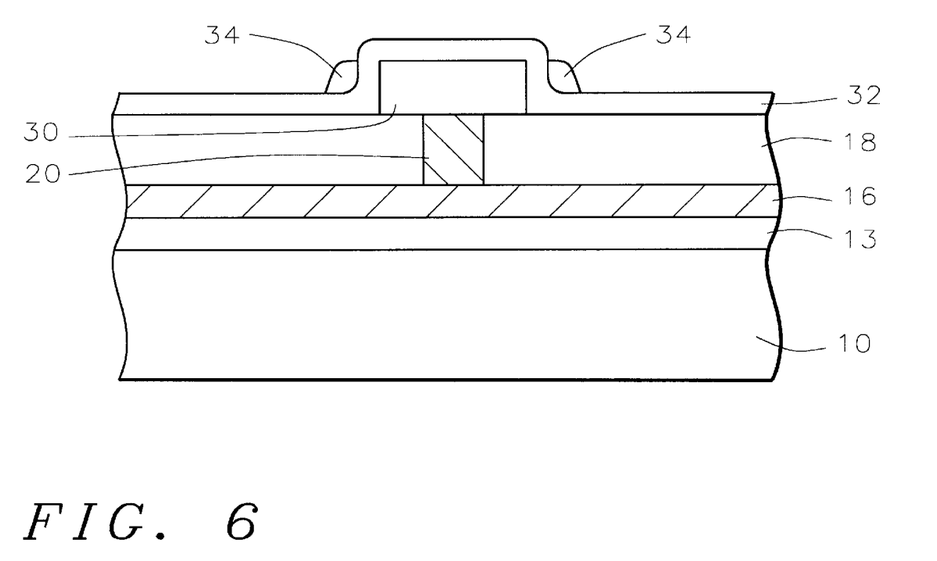

A first alternative intermetal dielectric layer deposition and etching process will be described with reference to FIGS. 5 through 7. Referring now to FIG. 5, a first layer of silicon oxide 32 is deposited over the antifuse layer 30 to a thickness of between about 500 and 2000 Angstroms. A second layer of silicon nitride 34 is deposited over the silicon oxide layer 30 to a thickness of between about 500 and 2000 Angstroms.

Now, the silicon nitride layer 34 is blanket etched with an etch stop on the oxide layer 32 plus a percentage overetch. The etch selectivity for silicon nitride with respect to silicon oxide should be greater than about 30 to 1. This results in the silicon nitride spacer 34 shown in FIG. 6.

Figure 7:
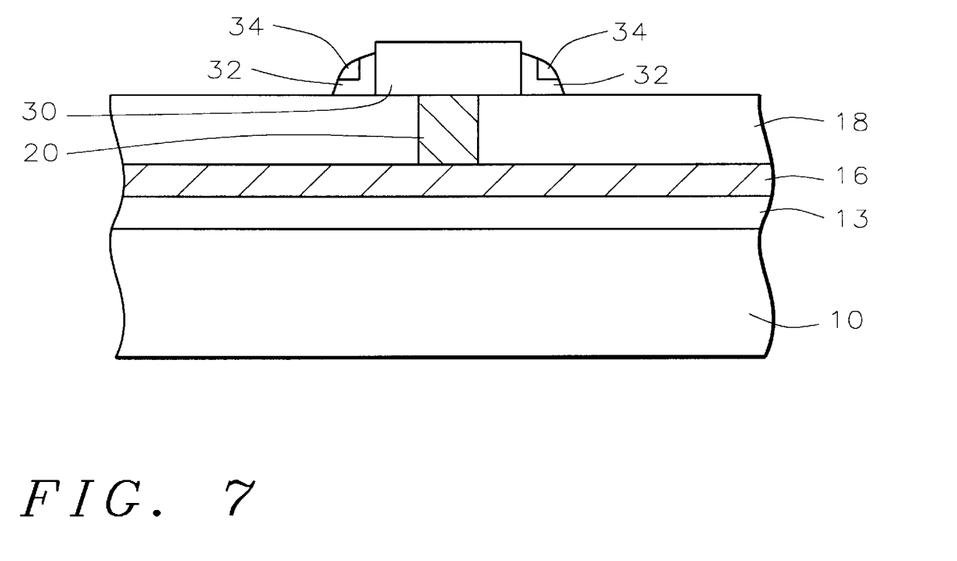

Next, an oxide timed etch is performed plus a percentage for the removal of the oxide layer, leaving the oxide spacers 32 underlying the nitride spacers 34, as shown in FIG. 7. The selectivity of this etch for silicon oxide with respect to silicon nitride should be greater than about 10 to 1.

Figure 8A:
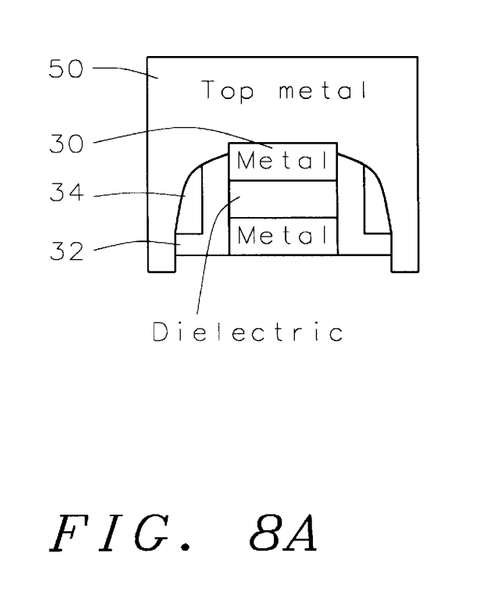
FIGS. 8A and 8B schematically illustrate in cross-sectional representation etch control results in the process of the invention.
Figure 8B:
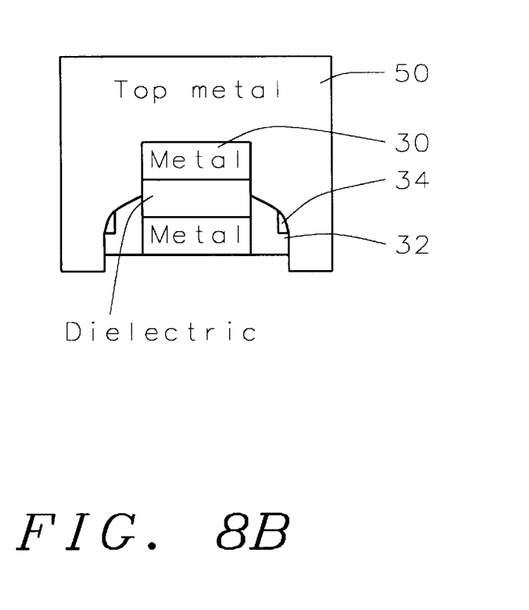

It is a challenge to control this etching process. FIG. 8A illustrates the spacers 34/32 formed by a well-controlled etch, while FIG. 8B illustrates spacers 34/32 formed by too much of an over etch. This may result in a shorting out of the antifuse to the top metal 50. The overetch process poses a challenge in any case, but the architecture of the present invention gives more of a process margin.

Figure 9:
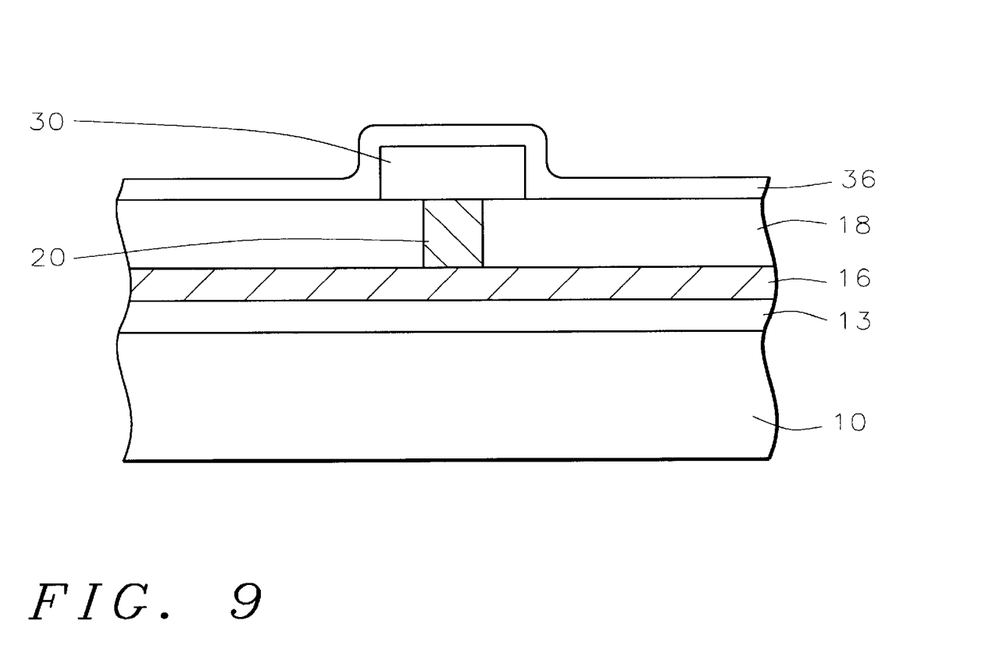
FIGS. 9 through 12 schematically illustrate in cross-sectional representation a second alternative in a preferred embodiment of the present invention.

A second alternative intermetal dielectric layer deposition and etching process will be described with reference to FIGS. 9 through 12. Referring now to FIG. 9, a first layer of a silicon-based dielectric material 36 is deposited over the antifuse layer 30 to a thickness of between about 500 and 2000 Angstroms. This material may be any silicon-based dielectric material such as silicon oxide (doped or undoped), silicon nitride, or silicon oxynitride.

Figure 10:
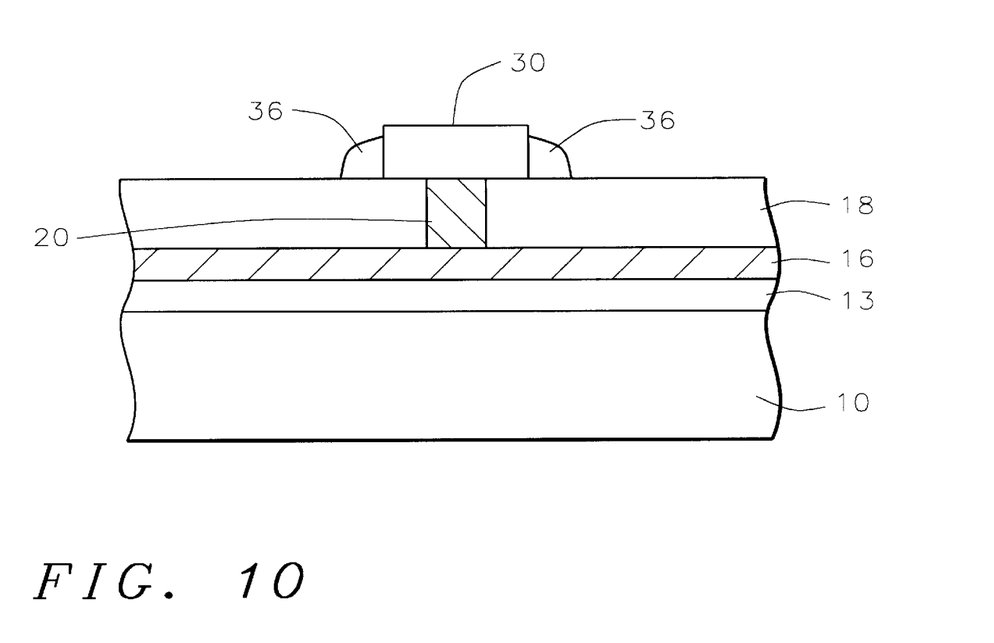

Now, the first dielectric layer 36 is etched using a blanket timed etch to form the dielectric spacer 36 shown in FIG. 10.

Figure 11:
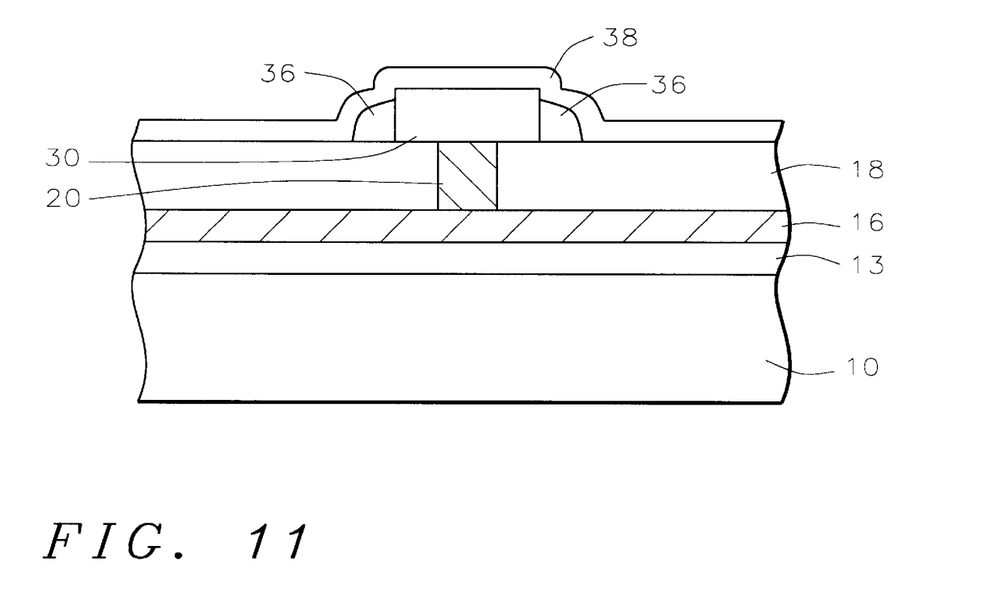

A second thinner layer 38 of the same dielectric material as 36 is deposited over spacers 36 to a thickness of between about 500 and 2000 Angstroms, as illustrated in FIG. 11.

Figure 12:
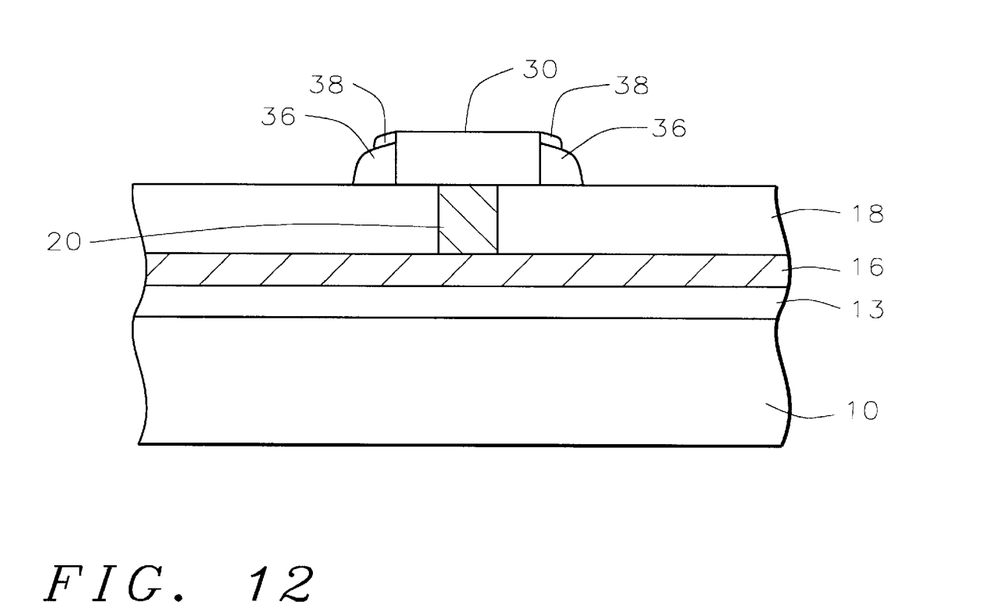

A blanket timed etch of the second layer forms the second spacers 38 shown in FIG. 12. This deposition-etch cycle can be repeated until the proper isolation spacer is obtained.

Figure 13:
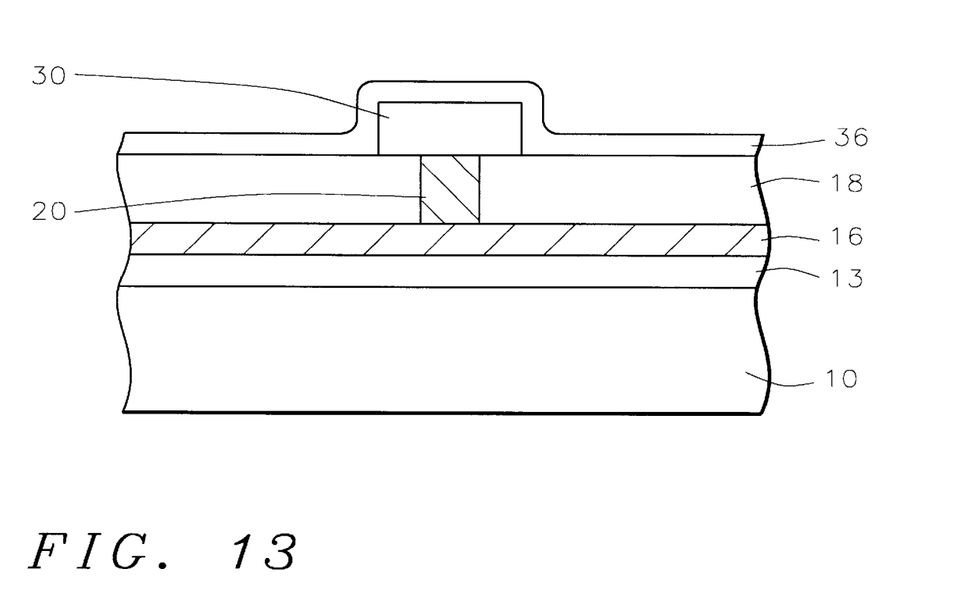
FIGS. 13 through 17 schematically illustrate in cross-sectional representation a third alternative in the preferred embodiment of the present invention.

A third alternative intermetal dielectric layer deposition and etching process will be described with reference to FIGS. 13 through 17. Referring now to FIG. 13, a first layer of a silicon-based dielectric material 36 is deposited over the antifuse layer 30 to a thickness of between about 500 and 2000 Angstroms. This material may be any silicon-based dielectric material such as silicon oxide (doped or undoped), silicon nitride, or silicon oxynitride.

Figure 14:
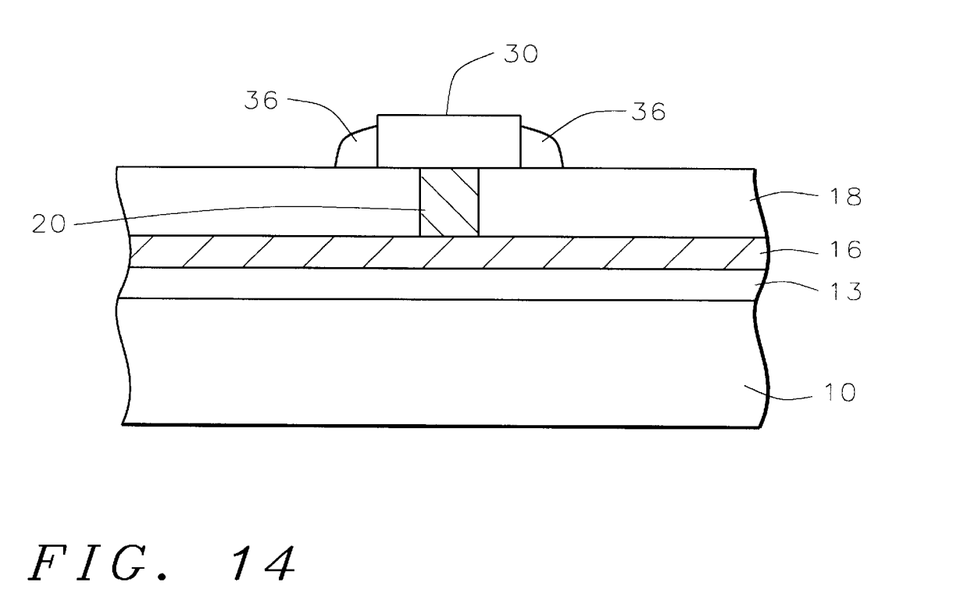

Now, the first dielectric layer 36 is etched using a blanket timed etch to form the dielectric spacer 36 shown in FIG. 14.

Figure 15:
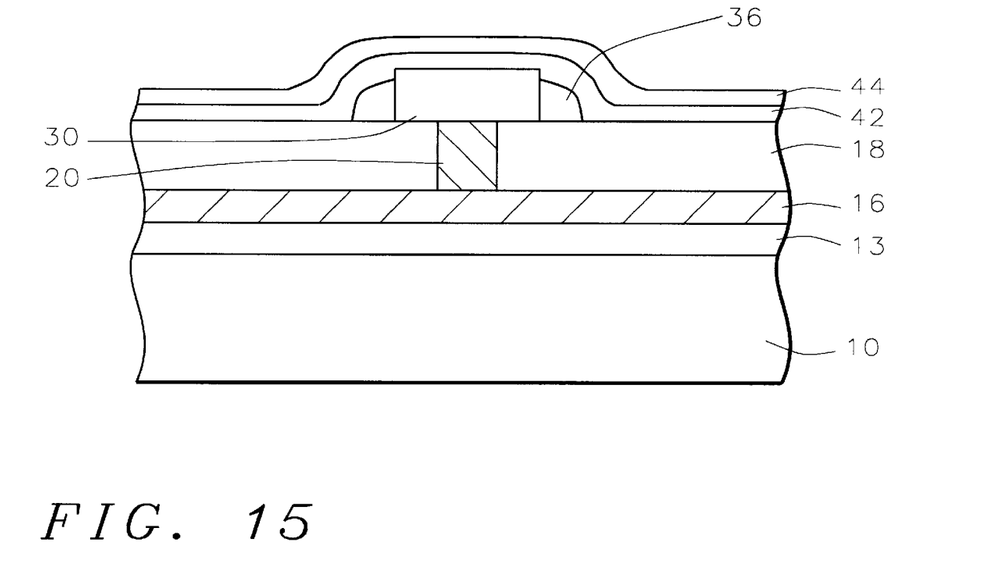

Now, thinner layers of dielectric material 42 and 44 are deposited over spacers 36 to a thickness of between about 500 and 2000 Angstroms for material 42 and between about 500 and 2000 Angstroms for material 44, as illustrated in FIG. 15. Dielectric materials 42 and 44 should be different from one another, and may or may not be different from the first layer 36. For example, the layers 36/42/44 may be oxide/nitride/oxide having thicknesses of 1000 Angstroms, 500 Angstroms, and 500 Angstroms, respectively.

Figure 16:
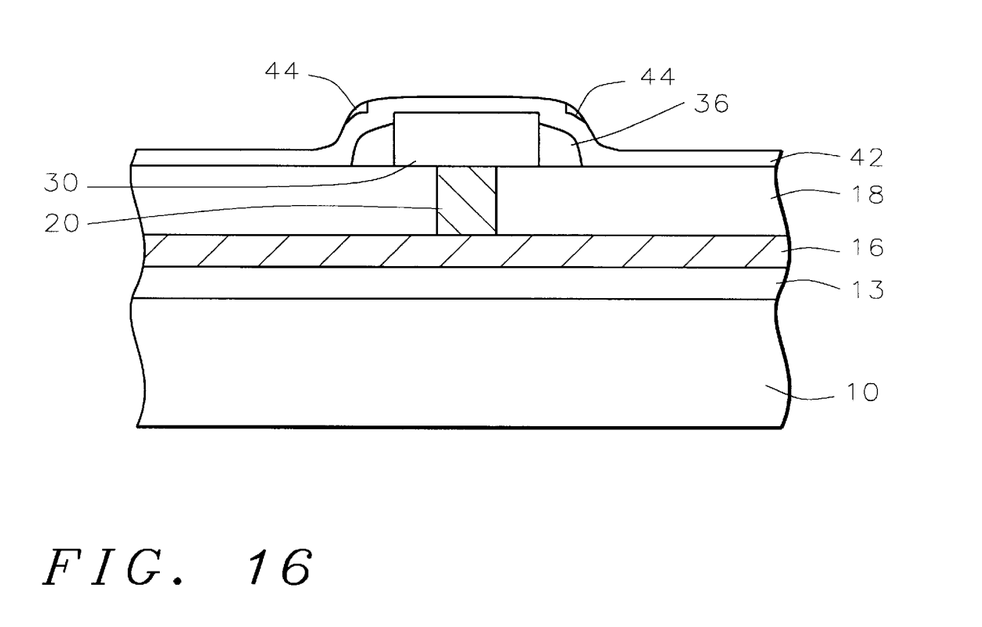

A blanket etch of the third layer, stopping on the second layer forms the third spacers 44 shown in FIG. 16. The etch selectivity of the third layer with respect to the second layer should be more than about 30 to 1.

Figure 17:
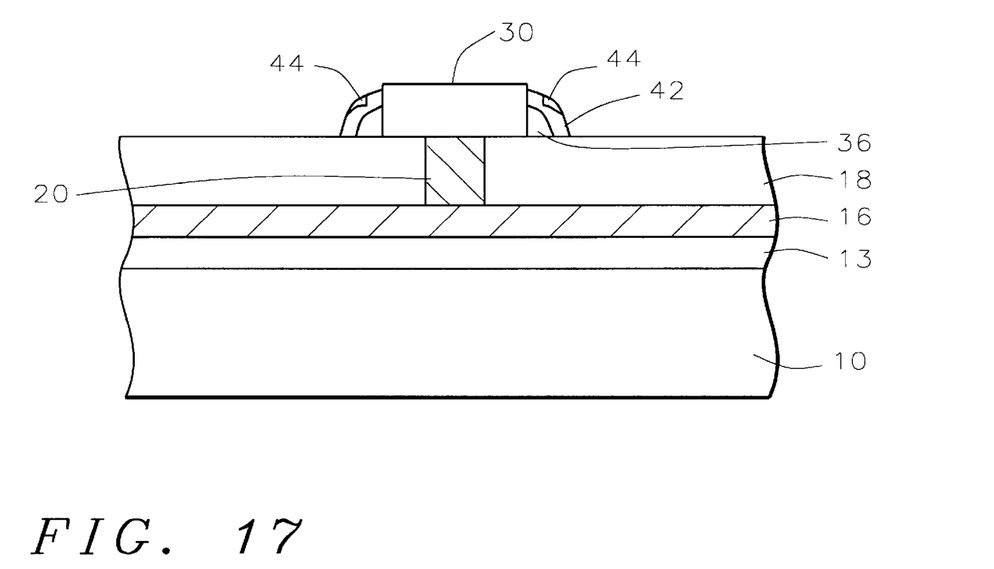

Referring now to FIG. 17, a blanket etch of the second layer, stopping on the dielectric layer 18 forms the second spacers 42. The etch selectivity of the second layer with respect to the dielectric layer 18 should be more than about 10 to 1. This completes the antifuse isolation comprising the three dielectric spacers 36,42,44.

Figure 18:
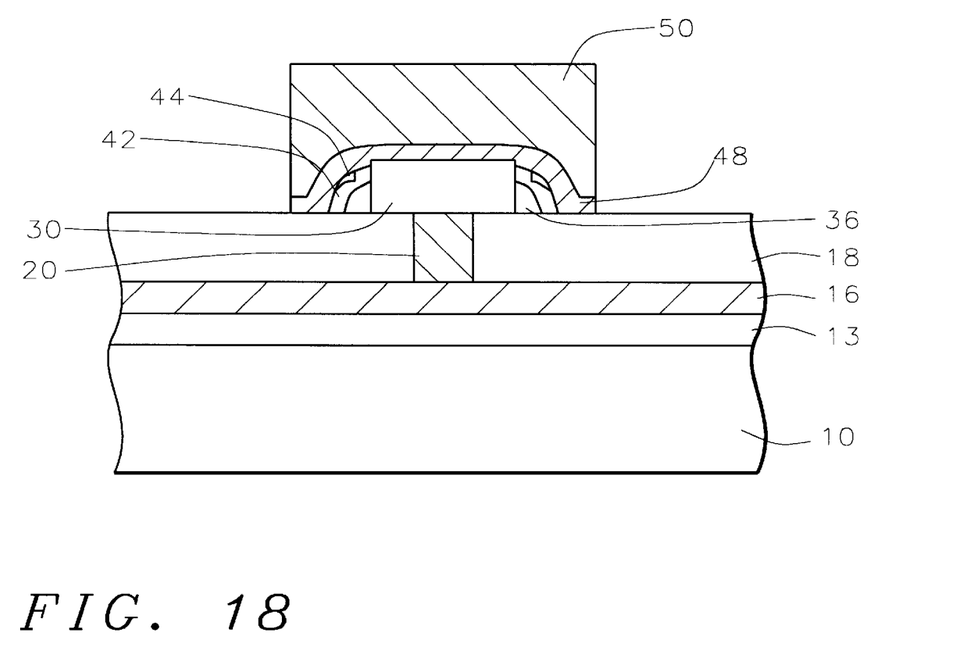
FIG. 18 schematically illustrates in cross-sectional representation a completed antifuse cell of the present invention.

Finally, after any one of the three alternative dielectric deposition and etching steps have been completed, that is, following FIGS. 7, 12, or 17, the top metal layer is deposited. Typically, a barrier layer such as titanium nitride is first deposited over the antifuse layer and dielectric layer. For example, FIG. 18 shows titanium nitride layer 48 deposited over the antifuse and dielectric layers illustrated in FIG. 17. Top metal layer 50, such as aluminum, is deposited over the barrier layer. Layers 48 and 50 are etched to complete the antifuse cell, as shown.

The process of the invention provides an effective method of fabricating an antifuse cell without a contact masking process. Fewer process steps, less polymer generation, higher programming yield, and increased contact area between the top metal and the antifuse are some of the advantages realized by the process of the present invention.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an antifuse cell in an integrated circuit device comprising:

providing an antifuse overlying a metal plug in an insulating layer on a semiconductor substrate;

depositing a dielectric layer overlying said antifuse;

etching said dielectric layer to form dielectric spacers on the sidewalls of said antifuse;

depositing a top metal layer overlying said antifuse and said dielectric spacers; and patterning said top metal layer to complete said antifuse cell in said integrated circuit device.

2. The method according to claim 1 wherein said metal plug contacts an underlying metal line over a second insulating layer.

3. The method according to claim 2 wherein said second insulating layer covers semiconductor device structures including a plurality of gate electrodes and their associated source and drain regions.

4. The method according to claim 1 wherein said steps of depositing said dielectric layer and etching said dielectric layer comprise:
   depositing a silicon oxide layer overlying said antifuse;
   depositing a silicon nitride layer overlying said silicon oxide layer;
   blanket etching said silicon nitride layer with an etch stop on said silicon oxide layer to form silicon nitride spacers on said silicon oxide layer; and
   blanket etching said silicon oxide layer to form silicon oxide spacers on said sidewalls of said antifuse underlying said silicon nitride spacers.

5. The method according to claim 4 wherein said step of blanket etching said silicon nitride layer has an etch selectivity of silicon nitride with respect to silicon oxide of greater than about 30 to 1.

6. The method according to claim 4 wherein said step of blanket etching said silicon oxide layer is a timed etch having an etch selectivity of silicon oxide with respect to silicon nitride of greater than about 10 to 1.

7. The method according to claim 1 wherein said steps of depositing said dielectric layer and etching said dielectric layer comprise:
   depositing a first silicon-based dielectric layer overlying said antifuse;
   blanket etching said first silicon-based dielectric layer to form first spacers on said sidewalls of said antifuse;
   depositing a second layer of same said silicon-based dielectric layer overlying said antifuse and said first spacers; and
   blanket etching said second layer to form second spacers on said sidewalls of said antifuse on top of said first spacers.

8. The method according to claim 7 wherein said steps of depositing same said silicon-based dielectric layer and blanket etching said layer are repeated until a stack of spacers is formed to cover said sidewalls of said antifuse.

9. The method according to claim 7 wherein said second silicon-based dielectric layer is thinner than said first silicon-based dielectric layer.

10. The method according to claim 8 wherein said each subsequent silicon-based dielectric layer is thinner than its preceding silicon-based dielectric layer.

11. The method according to claim 1 wherein said steps of depositing said dielectric layer and etching said dielectric layer comprise:
   depositing a first silicon-based dielectric layer overlying said antifuse;
   blanket etching said first silicon-based dielectric layer to form first spacers on said sidewalls of said antifuse;
   depositing a second silicon-based dielectric layer overlying said antifuse and said first spacers wherein said second layer can be etched selectively with respect to said insulating layer;
   depositing a third silicon-based dielectric layer overlying said second layer wherein said third layer can be etched selectively with respect to said second layer;
   blanket etching said third layer with an etch stop on said second layer to form third spacers on said second layer; and
   blanket etching said second layer with an etch stop on said insulating layer to form second spacers on said sidewalls of said antifuse and overlying said first spacers and underlying said third spacers.

12. The method according to claim 11 wherein said step of blanket etching said third layer has an etch selectivity of said third layer with respect to said second layer of greater than about 30 to 1.

13. The method according to claim 11 wherein said step of blanket etching said second layer has an etch selectivity of said second layer with respect to said insulating layer of greater than about 10 to 1.

14. A method of fabricating an antifuse cell in an integrated circuit device comprising:
   providing an antifuse overlying a metal plug in an insulating layer on a semiconductor substrate;
   depositing a silicon oxide layer overlying said antifuse;
   depositing a silicon nitride layer overlying said silicon oxide layer;
   blanket etching said silicon nitride layer with an etch stop on said silicon oxide layer to form silicon nitride spacers on said silicon oxide layer;
   blanket etching said silicon oxide layer to form silicon oxide spacers on sidewalls of said antifuse underlying said silicon nitride spacers wherein said silicon oxide and silicon nitride spacers together form dielectric spacers on the sidewalls of said antifuse;
   depositing a top metal layer overlying said antifuse and said dielectric spacers; and
   patterning said top metal layer to complete said antifuse cell in said integrated circuit device.

15. The method according to claim 14 wherein said metal plug contacts an underlying metal line over a second insulating layer.

16. The method according to claim 14 wherein said second insulating layer covers semiconductor device structures including gate electrodes and associated source and drain regions.

17. The method according to claim 14 wherein said step of blanket etching said silicon nitride layer has an etch selectivity of silicon nitride with respect to silicon oxide of greater than about 30 to 1.

18. The method according to claim 14 wherein said step of blanket etching said silicon oxide layer is a timed etch having an etch selectivity of silicon oxide with respect to silicon nitride of greater than about 10 to 1.

19. A method of fabricating an antifuse cell in an integrated circuit device comprising:
   providing an antifuse overlying a metal plug in an insulating layer on a semiconductor substrate;
   depositing a first silicon-based dielectric layer overlying said antifuse;
   blanket etching said first silicon-based dielectric layer to form first spacers on said sidewalls of said antifuse;
   depositing a second layer of same said silicon-based dielectric layer overlying said antifuse and said first spacers;
   blanket etching said second layer to form second spacers on said sidewalls of said antifuse on top of said first spacers wherein said first and second spacers together form dielectric spacers on the sidewalls of said antifuse;
   depositing a top metal layer overlying said antifuse and said dielectric spacers; and
   patterning said top metal layer to complete said antifuse cell in said integrated circuit device.

20. The method according to claim 19 wherein said metal plug contacts an underlying metal line over a second insulating layer.

21. The method according to claim 19 wherein said second insulating layer covers semiconductor device structures including gate electrodes and associated source and drain regions.

22. The method according to claim 19 wherein said steps of depositing same said silicon-based dielectric layer and blanket etching said layer are repeated until a stack of spacers is formed to cover said sidewalls of said antifuse.

23. The method according to claim 22 wherein said each subsequent silicon-based dielectric layer is thinner than its preceding silicon-based dielectric layer.

24. The method according to claim 19 wherein said second silicon-based dielectric layer is thinner than said first silicon-based dielectric layer.

25. A method of fabricating an antifuse cell in an integrated circuit device comprising:

providing an antifuse overlying a metal plug in an insulating layer on a semiconductor substrate;

depositing a first silicon-based dielectric layer overlying said antifuse;

blanket etching said first silicon-based dielectric layer to form first spacers on said sidewalls of said antifuse;

depositing a second silicon-based dielectric layer overlying said antifuse and said first spacers wherein said second layer can be etched selectively with respect to said insulating layer;

depositing a third silicon-based dielectric layer overlying said second layer wherein said third layer can be etched selectively with respect to said second layer;

blanket etching said third layer with an etch stop on said second layer to form third spacers on said second layer;

blanket etching said second layer with an etch stop on said insulating layer to form second spacers on said sidewalls of said antifuse and overlying said first spacers and underlying said third spacers wherein said first, second, and third spacers together form dielectric spacers on the sidewalls of said antifuse;

depositing a top metal layer overlying said antifuse and said dielectric spacers; and patterning said top metal layer to complete said antifuse cell in said integrated circuit device.

26. The method according to claim 25 wherein said metal plug contacts an underlying metal line over a second insulating layer.

27. The method according to claim 25 wherein said second insulating layer covers semiconductor device structures including gate electrodes and associated source and drain regions.

28. The method according to claim 25 wherein said step of blanket etching said third layer has an etch selectivity of said third layer with respect to said second layer of greater than about 30 to 1.

29. The method according to claim 25 wherein said step of blanket etching said second layer has an etch selectivity of said second layer with respect to said insulating layer of greater than about 10 to 1.

* * * * *

UNITED STATES PATENT AND TRADEMARK OFFICE
CERTIFICATE OF CORRECTION

| | | |
|---|---|---|
| PATENT NO. | : 6,362,102 B1 | Page 1 of 1 |
| DATED | : March 26, 2002 | |
| INVENTOR(S) | : Say Gut Piew and Yeow Meng Teo | |

It is certified that error appears in the above-identified patent and that said Letters Patent is hereby corrected as shown below:

<u>Title page,</u>
Please add Item [74], -- *Attorney, Agent,* or *Firm* - George O. Saile; Rosemary L.S. Pike --.

Signed and Sealed this

Eleventh Day of June, 2002

Attest:

Attesting Officer

JAMES E. ROGAN
*Director of the United States Patent and Trademark Office*